United States Patent [19]

Miller

[11] Patent Number: 4,978,567

[45] Date of Patent: Dec. 18, 1990

[54] WAFER HOLDING FIXTURE FOR CHEMICAL REACTION PROCESSES IN RAPID THERMAL PROCESSING EQUIPMENT AND METHOD FOR MAKING SAME

[75] Inventor: Michael B. Miller, DeSoto, Tex.

[73] Assignee: Materials Technology Corporation, subsidiary of the Carbon/Graphite Group, Inc., Rowayton, Conn.

[21] Appl. No.: 175,707

[22] Filed: Mar. 31, 1988

[51] Int. Cl.⁵ .......................... B32B 3/02; C23C 16/00
[52] U.S. Cl. ..................................... 428/157; 428/408; 428/698; 428/9; 428/34.4; 428/64; 428/65; 428/174; 428/177; 428/166; 428/220; 156/610; 219/10.491; 118/725
[58] Field of Search .......................... 428/408, 698-699, 428/34.4, 64, 65, 174, 157, 177, 166, 220; 156/610; 219/10.491; 118/725

[56] References Cited

U.S. PATENT DOCUMENTS

| | | | |
|---|---|---|---|
| 4,417,347 | 11/1983 | Muka et al. | 373/158 |
| 4,481,406 | 6/1984 | Muka | 219/411 |
| 4,499,354 | 2/1985 | Hill et al. | 219/10.491 |
| 4,512,825 | 4/1985 | Addamiano et al. | 156/610 |
| 4,522,149 | 6/1985 | Garbis et al. | 219/10.491 |
| 4,633,051 | 12/1986 | Olson | 118/725 X |
| 4,710,428 | 12/1987 | Tamamizu et al. | 428/698 X |
| 4,722,762 | 2/1988 | Luhleich et al. | 428/408 X |
| 4,767,666 | 8/1988 | Bunshah et al. | 428/698 X |
| 4,772,498 | 9/1988 | Bertin et al. | 428/34.4 |
| 4,816,338 | 3/1989 | Terasaki et al. | 428/212 X |
| 4,830,919 | 5/1989 | Shuford | 428/408 |

FOREIGN PATENT DOCUMENTS 62-124909 6/1987 Japan.

OTHER PUBLICATIONS

U.S. Ser. No. 933,007, Filed Nov. 20, 1986, entitled "Silicon Carbide Capillaries".

Primary Examiner—Ellis P. Robinson
Assistant Examiner—William P. Watkins, III

[57] ABSTRACT

A semiconductor wafer holding and support fixture having a low effective thermal mass comprises a planar surface having a recess for a wafer and consisting essentially of chemical vapor deposited silicon carbide. The wafer holder is specifically designed to isolate the wafer from regions of significant thermal mass of the holder. The wafer holder is particularly adapted for accomplishing chemical reactions in rapid thermal processing equipment in the fabrication of electronic integrated circuits. The method for making such an article comprises shaping a substrate, e.g. graphite, to provide a planar surface having a recess installing means for masking any regions of the substrate where silicon carbide is not desired, chemically vapor depositing a conformal outer coating of silicon carbide onto the substrate, removing the means for masking and removing the graphite by machining, drilling, grit-blasting, dissolving and/or burning.

8 Claims, 2 Drawing Sheets

WAFER HOLDING FIXTURE FOR CHEMICAL REACTION PROCESSES IN RAPID THERMAL PROCESSING EQUIPMENT AND METHOD FOR MAKING SAME

TECHNICAL FIELD

This invention relates to wafer holding and support fixtures having low effective thermal mass and a method for making such fixtures.

BACKGROUND OF THE INVENTION

Rapid thermal processing equipment has found prior application in the manufacture of electronic integrated circuits in processing not involving a chemical reaction such as thermal annealing in Rapid Thermal Annealing (RTA) apparatus manufactured by such companies as Varian Associates, Inc., A.G. Associates and Eaton Corporation. The semi-conductor wafers are treated in an RTA from room temperatures to about 400° to 1400° C. in periods of time on the order of a few seconds. The ability of such RTA systems to rapidly heat and cool a wafer from room temperature to such high temperatures in periods of up to 10 seconds make them attractive for use in chemical reaction processes such as epitaxial film, amorphous silicon or polycrystalline silicon deposition. Such processes are referred to as Rapid Thermal processing (RTP) systems. Examples of such RTP systems currently being sold for chemical reaction purposes are manufactured by ASM Epi and AG Associates.

The wafer holding fixtures and other components of RTA equipment have in the past been comprised of quartz which results in inherent problems with its use. Quartz is inadequate in RTP systems because of the effect the process reaction environment has on quartz and the thermal incompatibility with materials that are deposited on quartz surfaces. There is a need for wafer holding fixtures for use in RTP systems consisting of materials other than quartz.

U.S. Pat. No. 4,481,406 discloses that wafer support structures formed of non-conductive refractive materials such as a ceramic material are useful in RTP equipment. Wafer holders of, for example, silicon carbide chemical vapor deposited on graphite provide the necessary compatibility with process environment and resists the thermal shock of rapid temperature fluctuations from room temperature to 1400° C. In a typical chemical vapor deposition (CVD) process, the graphite or other substrate to be coated is heated in a suitable reactor and then a silicon-containing gaseous reactant mixture is introduced to the reactor. The gaseous reactant mixture reacts at the surface of the substrate to form a coherent and adherent layer of the desired coating. By varying the gaseous reactant mixture and other CVD process parameters, various types of deposit coatings can be produced. The disadvantage of using a CVD coated substrate is that the thermal mass of all of these prior art support structures is high relative to that of the wafer so that they do not undergo the rapid temperature changes that are needed in RTA and RTP systems. This makes such applications for such CVD coated substrates unattractive.

U.S. Pat. No. 4,417,347 discloses the use of metal membranes of tantalum and molybdenum having the necessary low thermal mass to facilitate the rapid heating and cooling for RTA systems. However, such materials are not useful in RTP systems because of the reaction between the metals and the silicon which form metal silicides in the epi process. Such reactions create unacceptable problems of particulates in the epi system and contamination of the wafers being processed.

SUMMARY OF THE INVENTION

In contrast, the fixtures of the present invention overcome the disadvantages of the prior art wafer holders presently being used in RTA and RTP systems. The wafer holders of this invention are not reactive with the process environment and have a thermal mass more comparable to that of the wafers they support. This results in an order of magnitude difference in the thermal response time of the RTP systems which use the holders of this invention when compared to the CVD coated substrate holders or supports of the prior art.

The fixture comprises a planar surface containing a recess to receive the wafer with the planar surface consisting essentially of chemical vapor deposited (CVD) silicon carbide. In one embodiment of the present invention, a sidewall is connected to the planar surface and has a height greater than the depth of the recess. The sidewall may extend either above or below the planar surface. The sidewall may be perpendicular to the planar surface or form either an acute or obtuse angle therefrom. Its particular configuration will depend on the particular RTA or RTP in which it is placed. To provide for added stability, a peripheral annular section or annulus is attached to the sidewall. To provide for additional structural rigidity if required for a given application, the annulus comprises silicon carbide deposited onto graphite. In those cases where such rigidity is not required, the graphite can be removed as set forth below to leave the annulus hollow. If the graphite is allowed to remain in the annulus, it is essential that the annulus be sufficiently remote from the recess as allowed by the reaction chamber design and by the thin cross-section of the silicon carbide planar surface or membrane between the annulus and the wafer. This means that the semiconductor wafer being processed is isolated from any significant thermal mass of the holder and will provide the necessary rapid thermal response of the wafer.

The method for making the fixture comprises shaping a block of graphite or other suitable substrate material into the desired configuration for the particular RTA or RTP application. The minimum shaping requires that the substrate includes a planar surface containing the recess. Means for masking are provided for those regions of the substrate which are not to receive a CVD coating of silicon carbide, i.e. those regions in which the substrate is to be removed. Such masking means are provided at least in those regions on the backside of the fixture adjacent to the wafer recess. The substrate is then chemical vapor deposited with silicon carbide in a manner, for example, as that set forth in U.S. Pat. No. 4,772,498, issued 20 Sept. 1988. The silicon-containing gas used to form the silicon carbide coating can be selected from the group consisting of silicon tetrachloride, silane, chlorosilane, trichlorosilane, methyl trichlorosilane and dimethyl dichlorosilane. If silicon tetrachloride, silane, dichlorosilane or trichlorosilane is used, it is necessary to supply a source of carbon to produce silicon carbide. The source of carbon can be any hydrocarbon, preferably low molecular weight aliphatic hydrocarbons such as paraffins, alkenes and alkynes having 1 to 6 carbon atoms, and aromatics and other hydrocarbons having 1 to 6 carbon atoms which do not contain oxygen, particularly suitable examples include, methane, ethane, propane, butane, methylene, ethylene, propylene, butylene, acetylene, and benzene.

The substrate is removed in the region immediately adjacent to the wafer recess, which region has not been coated with silicon carbide. This can be done by machining, grit-blasting, drilling, dissolving or burning. Japanese Kokai Pat. No. 62-124909, published 6 June 1987, describes various methods for removing substrate material in the method of making ceramic reaction tubes used in the semiconductor manufacture in which the substrate is first chemically vapor deposited with silicon carbide and the substrate is then removed by combustion or dissolution with a suitable acid or solvent.

BRIEF DESCRIPTION OF THE DRAWINGS

For a more complete understanding of the present invention, the accompanying drawings are provided in which.

DETAILED DESCRIPTION OF THE INVENTION

Figure 1:
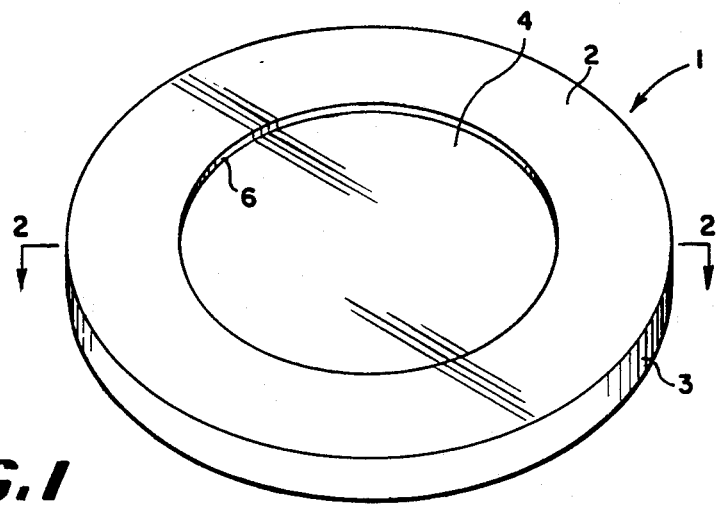
FIG. 1 is a perspective view of one embodiment of the wafer holding fixture of the present invention having a solid recess.
Figure 2:
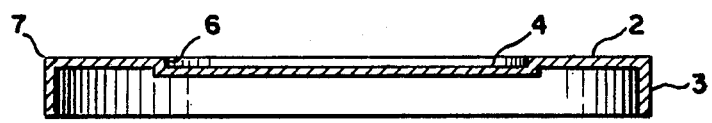
FIG. 2 is a cross-sectional view of the fixture taken through 2—2.

Referring now to FIGS. 1 and 2, wafer holder 1 consisting of CVD silicon carbide has upper planar surface 2 and sidewall 3 each having a thickness in the range of about 0.015 to about 0.025 inches. Planar surface 2 has solid recess 4 having a depth substantially the same as the thickness of holder 1 and has inner rim 6 and outer rim 7.

Figure 3:
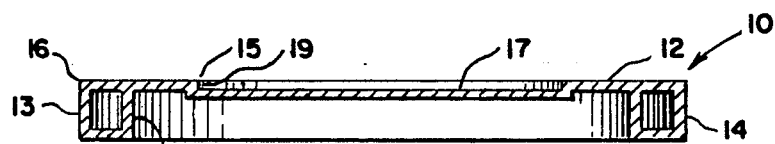
FIG. 3 is a cross-sectional view of another embodiment of the fixture having an annular section.

FIG. 3 illustrates another embodiment of the present invention in which holder 10 has upper planar surface 12, sidewall 13 and hollow annular section or annulus 14. Planar surface 12 has inner rim 15, outer rim 16 and solid recess 17 having outer edge 19 separated from inner rim 15 of planar surface 12 by the thickness of the CVD SiC. The width of hollow annulus 14, from inner sidewall 20 to sidewall 13, is less than 50% of the distance from inner rim 15 to outer rim 16 of planar surface 12 so that annulus 14 is sufficient distal to outer edge 19 of recess 17 to allow for the necessary rapid response time for the thermal change of the wafer and holder 10 in the RTA or RTP systems.

Figure 4:
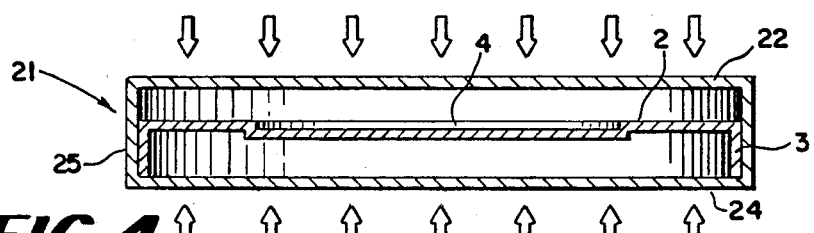
FIG. 4 is a cross-sectional view of the FIG. 3 placed within a typical RTP unit.

FIG. 4 illustrates holder 1 positioned within typical RTP system 21 comprising top and bottom closures 22 and 24 and external sources not shown, so that sidewall 3 of holder 1 matches sidewall 25 of system 21. It is apparent that the exact design of holder 1 will depend on the configuration of the particular RTP or RTA system selected.

Figure 5:
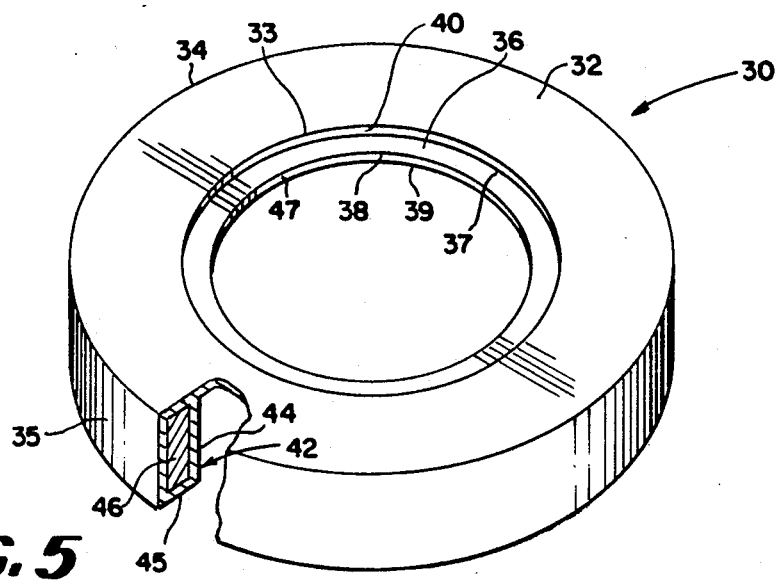
FIG. 5 is a perspective view of still another embodiment of the fixture of the present invention having a recess with an opening therethrough with a cut-away section showing the annulus.

FIG. 5 illustrates still another embodiment of this invention in which holder 30 comprises planar surface 32 having inner rim 33 and outer rim 34, vertical sidewall 35, open, annular recess 36 having outer edge 37 and upper inner edge 38 and lower inner edge 39. The thickness of sidewall 40 formed between inner edge 33 and outer edge 37 and the thickness of sidewall 41 formed between upper inner edge 38 and lower inner edge 39 is equivalent to the depth of the CVD deposition of silicon carbide. The cut-away view shows annulus 42 comprising silicon carbide coated inner vertical wall 44 and lower surface 45 on graphite core 46. The width of annulus 42 from coated sidewall 35 to inner wall 44 is approximately ½ the width of planar surface 32 from inner rim 33 and outer rim 34 so that annulus 42 is sufficient remote from recess 36 to result in the optimum thermal response for wafers on annular recess 36.

The wafer holder comprising simply a planar surface with a recess, which is not shown, has the fastest rapid response time of the fixtures of the present invention. However, an external positioning fixture is required to mount such a holder in an RTP. Holder 30 shown in FIG. 5 is the type of fixture having a very fast response time, as well as having the stability and rigidity without requiring an external positioning fixture. The disadvantage of holder 30 is that there is less control of the temperature of the exposed lower portion of the wafer mounted in annular recess 36 than in holders in which the recess is solid such as in holder 10 shown in FIG. 3.

Figure 6:
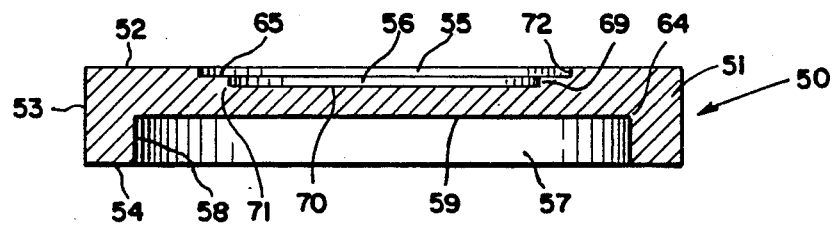
FIG. 6 is a cross-sectional view of the substrate which has been shaped into the configuration that is used to form the fixture of FIGURE 5.
Figure 7:
FIG. 7 is a cross-sectional view of one of the two masks used to form the fixture of FIG. 5.

FIGS. 6 and 7 illustrate the components used to make holder 30. Disk 50 comprising a suitable substrate material 51, e.g. graphite, has upper planar surface 52, outer sidewall 53 and lower planar surface 54. The first step of the method is to shape disk 50 into the desired configuration of holder 30 by machining upper planar surface 52 to form upper recess 55 in the center of disk 50 equidistant from its periphery. Upper recess 55 is machined to form lower recess 56. The next step is to flip disk 50 over and to machine lower planar surface 54 to form lower cylindrical space 57 having sidewall 58 and lower surface 59. Mask 60 having larger diameter surface 61 and smaller diameter 63 as shown in FIG. 7 is designed to mask lower surface 59 during the CVD coating step of the method of this invention while permitting coating of sidewall 58. It is critical that larger diameter surface 61 of mask 60 is smooth and has substantially the same diameter as the diameter of cylindrical space 57 so that larger diameter surface 61 forms a close fit with sidewall 58 at juncture 64 and with lower surface 59. The dimensions and the surface finish of smaller diameter surface 63 are not critical except that its diameter is significantly less than the diameter of larger diameter surface 61. Another mask not shown is of similar size and shape as mask except that the larger diameter surface of this mask is substantially the same as the diameter of lower recess 56 so as to form a close fit within wall 69 of lower recess 56 at juncture 71 and with lower surface 70 to mask lower surface 70 during the CVD coating while permitting coating of walls 69 and 72 of recesses 56 and 55, respectively.

In order to provide the necessary CVD coating, disk 50 and the mask not shown together with mask 60 mounted as set forth above are placed in any suitable CVD reactor. One example of such a reactor is described and illustrated in Ser. No. 933,077, filed 20 Nov. 1986 now U.S. Pat. No. 4,772,498, issued 20 Sept. 1988.

A uniform thickness of silicon carbide is chemically vapor deposited onto upper planar surface 52, outer sidewall 53, lower planar surface 54, sidewall 58, annular surface 65, and walls 69 and 72 as well as the exposed surfaces of the mask not shown and mask 60, i.e. smaller diameter surfaces not shown and 63 and sloping sidewall not shown and 62, to a depth equal to the desired thickness of holder 1. The substrate is withdrawn from the CVD reactor and the masks are removed from recess 55 and cylindrical space 57. At least a substantial portion of the graphite of uncoated inner surface 70 and lower surface 59 and adjacent to inner sidewall 58 are removed by machining. For example, SiC coated disk 50 is bored from the center of inner surface 70 out to wall 69 by a vertical milling machine. Then a diamond grinding wheel is used to grind smooth the surface of the silicon carbide coating adjacent juncture 69. Coated disk 50 is flipped over and the graphite above uncoated surface 59 is milled to within a fraction of an inch of the silicon coating on upper planar surface 52 and annular surface 65 and the remaining fraction of an inch of graphite is grit blasted away to result in support 30 shown in FIG. 5. Graphite core 46 at this stage in the process contains coated sidewall, coated inner surface 45 and partially coated region between coated sidewall 53 and at least partially coated inner wall 45. Support 30 is then placed into the reactor to coat an additional fraction of an inch of silicon carbide over the exposed graphite surface of inner surface 70. After the second CVD coating, inner wall 45 is slightly tapered due to the combined effects of the second coating and the lower gas diffusion on the inner surface closer to the backside of upper planar surface 52. The fact that the SiC coating on inner wall 45 is tapered inward because the fabrication process is not critical to the ultimate function of holder 30.

In the embodiment shown in FIG. 30, the graphite core is removed by drilling a series of holes in inner wall 45 and support 30 is then placed in a furnace and heated to about 1200° C. to burn out the graphite that remains in graphite core 46. If it is believed necessary, the fixture can be returned to the CVD reactor to coat over any of the holes.

The example below illustrates the foregoing process of preparing the fixtures of the present invention.

EXAMPLES

Example 1

Two of the three components composed of SiC6 graphite supplied by Toyo Tanso Ltd. were fabricated into the shapes corresponding to FIGURES 6 and 7. The third component, not shown, had substantially the same shape as that of mask 60 shown in FIG. 7. The component of disk 50 shown in FIG. 6 had an outside diameter of about 6 inches and was about 0.5 inches thick. The thickness of sidewall 58 was approximately 0.25 inches, and the depth of recess 68 and of recess 55 were each 0.025 inches. The three graphite components were subsequently purified at 2,000° C. with chlorine gas in a high temperature purification reactor. The three components were assembled with the mask of FIG. 7 and the mask not shown were located in lower cylindrical space 57 and lower recess 56, respectively of the component of FIG. 5, as set forth above. The assembly was then placed into a CVD reactor and 0.020 to 0.025 inches of SiC was deposited onto its exposed surfaces by the pyrolysis of methyl trichlorosilane at 1250°–1300° C.

Subsequent to the CVD deposition step, the upper mask (not shown) was removed by making a single point diamond cut at juncture 71. Lower mask 60 was easily removed as there was substantially no coating at juncture 64 between sidewall 58 and inner surface 59 because of diffusion limitations during the deposition process. A hole was machined through the central region of disk 50 of substantially the same diameter as the diameter of recess 56. The coated disk 50 was flipped over and the uncoated graphite was machined to within 1/16 inch from the SiC on the backsides of upper planar surface 52 and annular surface 65. The remaining graphite was grit-blasted away backside of disk 40 which left a holder having sidewall, upper planar surface and recess containing a substantially silicon carbide of 0.025 inch, with an open central region, and a region of residual graphite which was not removed, which forms annulus 46. This structure was then placed back into the CVD reactor and the exposed graphite surface of inner sidewall of annulus 46 was coated with an additional 0.007 inch of SiC. The resulting holder 30 illustrated in FIG. 5 was removed from the reactor.

Holder 30 has been calculated to have a heat capacity of about 25 calories/° C. This is a reduction of over seventy-five per cent in heat capacity from a holder prepared by silicon carbide coating the graphite substrate, which was calculated to have a heat capacity of about 113 calories/degree C. Therefore, the heat-up rate of the support of the present invention in a uniform heat flux will be over four times that of prior art CVD coated graphite supports.

Example 2

Two components composed of SiC6 graphite supplied by Toyo Tanso, Ltd. were fabricated into a substrate component and a mask used in the preparation of holder 1 illustrated in FIGS. 1 and 2. The two graphite components were subsequently purified at about 2000° C. with chlorine gas in a high temperature purification reactor system. The two components were then assembled with the substrate component oriented with its recess upward, resting into the recess of the mask to prevent coating of the backside of the substrate component. The assembly was placed into a CVD reactor and 0.020–0.025 inches of SiC was deposited onto its exposed surfaces by the pyrolysis of methyl trichlorosilane at 1250°–1300° C. to form upper planar surface 2, sidewall 3, and solid recess 4 of holder 1.

Subsequent to the deposition step, the mask was removed from the substrate component by making a single point diamond cut at the juncture between the mask and the substrate component. The majority of the graphite was machined from the interior of this component from the masked, uncoated backside. A diamond grinder was used to smooth the exposed edge of the silicon carbide at such a juncture, and then the remaining graphite was removed by grit blasting.

The resulting holder 1 has been calculated to have a heat capacity of only about 10 calories/degree C., which is a reduction of over an order of magnitude from the calculated 113 calories/degree C. for the SiC coated graphite substrate. Therefore the heat-up rate of the support of the present invention in a uniform heat flux will be over ten times that of prior art CVD coated graphite supports.

Example 3

An alumina substrate is prepared in the form of a disk substantially in the shape of FIG. 1 having a recess in its upper planar surface and a thickness substantially the same as the desired thickness of the sidewall of the wafer support. The alumina is coated on all surfaces with a slurry of graphite powder in water and the powder is allowed to dry. The substrate is placed on a flat, circular graphite plate having a somewhat larger diameter than the disk which serves to mask the backside of the support from deposition of SiC. The substrate on the plate is then placed into a CVD reactor and is coated with a uniform coating of SiC having a thickness of about 20 thousandth of an inch. After the deposition, a single point diamond cut is made at the juncture of the substrate with the graphite plate in order to remove the substrate from the plate. The substrate of alumina coated with graphite powder has a higher coefficient of thermal expansion than the silicon carbide and will have shrunken away from the coating on cooling from deposition temperatures. The graphite powder coating will assist in preventing adhesion of the SiC coating to the substrate and the substrate can easily be removed from the silicon carbide part. The lower edge where the single point cut is made is smoothed with a diamond grinding step and lightly grit blasted on the lower surface. This will remove and residual graphite powder. Should an open recess area be provided as in FIG. 5 to further reduce the thermal mass in the vicinity of the wafer, the opening can be diamond machined or ground into the final part.

What is claimed is:

1. A wafer holding fixture of low thermal mass having a planar surface containing a recess capable of receiving a wafer and a sidewall having a height greater than the depth of said recess, said sidewall being connected to the edge of said planar surface sufficiently remote from said recess to provide rapid thermal response of the wafer that is at least four times more rapid than chemical vapor deposited coated graphite wafer holding fixtures sufficiently remote from said recess to provide rapid thermal response of the wafer that is at least four times more rapid than chemical vapor deposited coated graphite wafer holding fixtures and said planar surface and said sidewall consisting essentially of silicon carbide obtained by chemical vapor deposition of a coating of silicon carbide onto a substrate and removing the substrate, said fixture for use in a rapid thermal processing apparatus and said planar surface having a thickness in the range of about 0.015 inch to about 0.025 inch.

2. The fixture of claim 1 wherein said sidewall extends above said planar surface.

3. The fixture of claim 1 wherein said sidewall extends below said planar surface.

4. The fixture of claim 1 wherein an annular section is provided comprised of silicon carbide coated graphite.

5. The fixture of claim 4 wherein the annular section is hollow.

6. The fixture of claim 1 wherein the recess comprises an annular lip upon which the wafer is positioned and the remaining portion of the recess is open and free of material.

7. The use of the fixture of claim 1 in rapid thermal processing apparatus to accomplish chemical reactions.

8. The fixture of claim wherein the substrate is graphite.

* * * * *